United States Patent
Mun et al.

(10) Patent No.: US 7,889,023 B2
(45) Date of Patent: Feb. 15, 2011

(54) SWITCHING CIRCUIT FOR MILLIMETER WAVEBAND CONTROL CIRCUIT

(75) Inventors: Jae Kyoung Mun, Daejeon (KR); Dong Young Kim, Daejeon (KR); Jong Won Lim, Daejeon (KR); Ho Kyun Ahn, Daejeon (KR); Hae Cheon Kim, Daejeon (KR); Hyun Kyu Yu, Daejeon (KR)

(73) Assignee: Electronics and Telecomminucation Research Institute, Daejeon (KR)

( * ) Notice: Subject to any disclaimer, the term of this patent is extended or adjusted under 35 U.S.C. 154(b) by 24 days.

(21) Appl. No.: 12/139,046

(22) Filed: Jun. 13, 2008

(65) Prior Publication Data
US 2009/0146724 A1 Jun. 11, 2009

(30) Foreign Application Priority Data
Dec. 10, 2007 (KR) .............. 10-2007-0127884

(51) Int. Cl.
*H01P 1/10* (2006.01)
*H01P 3/08* (2006.01)

(52) U.S. Cl. ................... 333/101; 333/103

(58) Field of Classification Search ............ 333/262, 333/101, 103, 104
See application file for complete search history.

(56) References Cited

U.S. PATENT DOCUMENTS 5,872,369 A 2/1999 Inokuchi 6,320,476 B1 11/2001 Tsukahara
6,842,880 B2 * 1/2005 Sasaki .................. 716/1
2008/0129427 A1 * 6/2008 Mun et al. ............ 333/262

FOREIGN PATENT DOCUMENTS

| JP | 2002-252302 A | 9/2002 |
| JP | 2002-290115 A | 10/2002 |
| JP | 2002353411 | 12/2002 |

OTHER PUBLICATIONS

Kim, Junghyun, A High-Performance 40-85 GHz MMIC SPDT Switch Using FET-Integrated Transmission Line Structure, IEEE Microwave and Wireless Components Letter, Dec. 2003, p. 505-507, vol. 13, No. 12, IEEE.

* cited by examiner

*Primary Examiner*—Dean O Takaoka
(74) *Attorney, Agent, or Firm*—Rabin & Berdo, P.C.

(57) ABSTRACT

Provided is a switching circuit for a millimeter waveband control circuit. The switching circuit for a millimeter waveband control circuit includes a switching cell disposed on a signal port path to match an interested frequency and including at least one transistor coupled vertically to an input/output transmission line and a plurality of ground via holes disposed symmetrically in an upper portion and a lower portion of the input/output transmission line; capacitors for stabilizing a bias of the switching cell; and bias pads coupled in parallel to the capacitor to control the switching cell. Therefore, the switching circuit may be useful to improve its isolation by simplifying its design and layout through the use of symmetrical structure of optimized switching cells without the separate use of different switch elements, and also to reduce its manufacturing cost through the improved yield of the manufacturing process and the enhanced integration since it is possible to reduce a chip size of an integrated circuit in addition to its low insertion loss.

10 Claims, 5 Drawing Sheets

SWITCHING CIRCUIT FOR MILLIMETER WAVEBAND CONTROL CIRCUIT

CROSS-REFERENCE TO RELATED APPLICATION

This application claims the priority of Korean Patent Application No. 2007-127884 filed on Dec. 10, 2007, in the Korean Intellectual Property Office, the disclosure of which is incorporated herein by reference.

BACKGROUND OF THE INVENTION

1. Field of the Invention

The present invention relates to a switching circuit for a millimeter waveband control circuit, and more particularly, to a switching circuit for a millimeter waveband control circuit capable of securing its high isolation and low voltage loss using a switching cell.

The present invention was supported by the IT R&D program of MIC/IITA[2006-S-039-03, SoP (System on Package) for 60 GHz Pico cell Communication].

2. Description of the Related Art

A millimeter waveband of several tens GHz has been widely used in microwave communication systems such as wireless LAN, radar system for car accidents prevention system, image radar system, etc., and a switching circuit for converting these radio frequency signals has been mainly used as a converter circuit and a transmission/reception converter circuit in an antenna.

Field effect transistors (FETs) such as a high electron mobility transistor (HEMT) or a metal-semiconductor field effect transistor (MESFET) has been widely used as a core element in the switching circuit. Here, the field effect transistor (FET) is a compound semiconductor transistor that has good transmission and drive voltage characteristics in a millimeter waveband and low power consumption, includes a simple bias circuit, and facilitate the implementation and integration of its multiple ports.

For such a switching circuit, there is required a technology of lowering its insertion loss as low as possible and diminishing its isolation damage by parasite components such as inductance or capacitance, etc. In particular, it is very important to design a high-isolation switching circuit for the purpose of production of a small microwave control circuit.

For this purpose, a single-pole double-throw (SPDT) switching circuit, which is mainly used for the change in a transmitting/receiving path of an ultrahigh frequency signal, mainly employs only a shunt structure since its series-shunt structure has very high insertion loss and makes it difficult to ensure the isolation in a millimeter waveband of several tens GHz, and it is difficult to realize an isolation of −30 dB or less in the transmitting/receiving path, the an isolation of −30 dB or less being required for a transceiver.

The shunt structure functions to block a flow into an output port by coupling a ground via hole to a drain electrode or a source electrode of the switch element and forcing an undesirable signal to flow into the ground under the control of the a gate voltage as a control voltage according to the millimeter wave signal inputted into the drain electrode or the source electrode.

A multi-stage shunt technology has been widely used in the conventional shunt structure to ensure the high isolation. However, the use of the multi-stage shunt technology results in the increases in the chip size and the manufacturing cost due to the presence of inductors or capacitors that are additionally mounted in the surroundings such as a transmission line, a plurality of field effect transistors and a switch element in a λ/4 transformer In order to solve the above problems, U.S. Pat. No. 6,320,476 (registered on Nov. 20, 2001) discloses a "millimeter-band semiconductor switching circuit" whose isolation is improved by minimizing a distance between a via hole and a transmission line.

However, the conventional switching circuits has a configuration in which a transmission line and a via hole are disposed vertically to each other so as to minimize a distance between the via hole and the transmission line. As a result, the conventional switching circuits have disadvantages that there is a limit on the isolation that may be ensured per a unit cell, and the insertion loss is also increased with the increase in the impedance of the transmission line since only two via holes are disposed in each of the switching circuits. Also, the conventional switching circuits have a problem that the manufacturing cost of chips is also still high like the convention multi-stage shunt technology.

SUMMARY OF THE INVENTION

The present invention is designed to solve the problems of the prior art, and therefore it is an object of the present invention to provide a switching circuit for a millimeter waveband control circuit that has high isolation and low insertion loss and is useful to design and manufacture millimeter waveband control circuits such as a phase shifter or a digital attenuator using switching characteristics by optimizing a cell structure to improve the OFF-state isolation without deteriorating the ON-state insertion loss.

According to an aspect of the present invention, there is provided a switching circuit for a millimeter waveband control circuit including a switching cell disposed on a signal port path to match an interested frequency and including at least one transistor coupled vertically to an input/output transmission line and a plurality of ground via holes disposed symmetrically in an upper portion and a lower portion of the input/output transmission line; capacitors for stabilizing a bias of the switching cell; and bias pads coupled in parallel to the capacitor to control the switching cell.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The switching circuit for a millimeter waveband control circuit according to one exemplary embodiment of the present invention employs a single-pole-double-throw (SPDT) switch microwave monolithic integrated circuit (MMIC) that is used to control the transmission/reception of an ultrahigh frequency signal in a millimeter waveband communication system. Also, the switching circuit for a millimeter waveband control circuit according to one exemplary embodiment of the present invention is suitable for designing and manufacturing chips in a small microwave integrated circuit in addition to having the high isolation and the low insertion loss.

The, a configuration of the switching circuit for a millimeter waveband control circuit (hereinafter, referred to as a 'switching circuit') will be described in detail with reference to the accompanying drawings.

Figure 1:
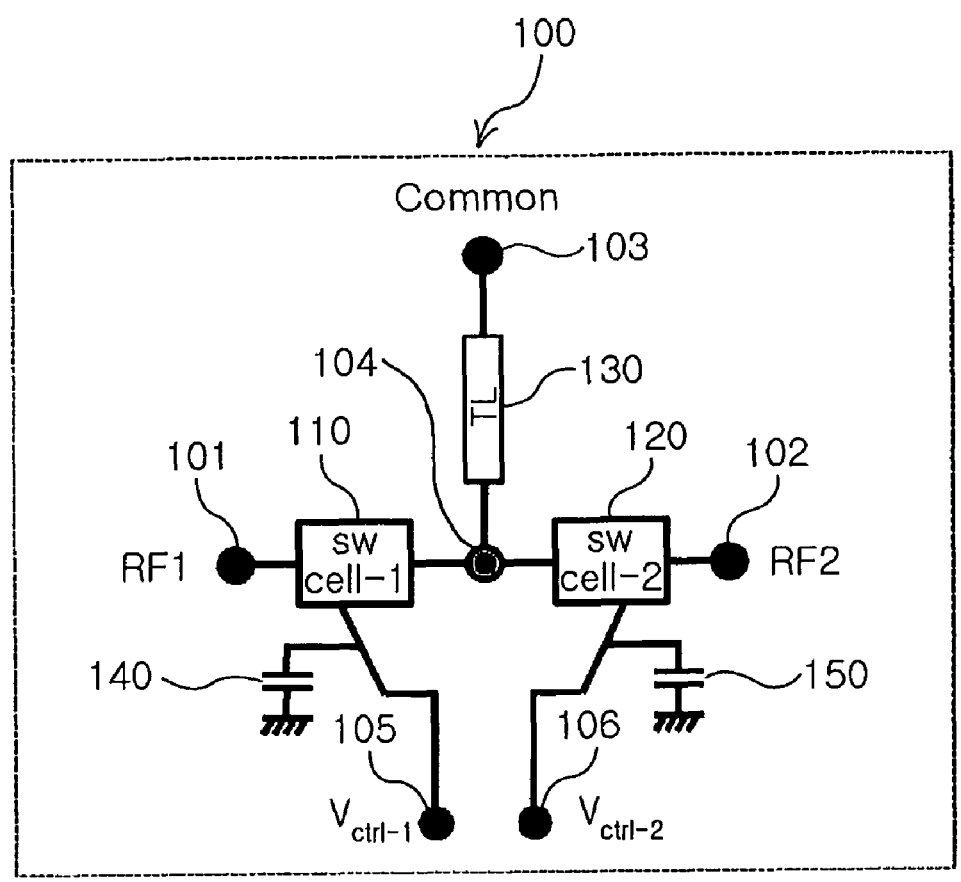
FIG. 1 is a diagram illustrating a configuration of a switching circuit for a millimeter waveband control circuit according to one exemplary embodiment of the present invention.

FIG. 1 is a diagram illustrating a configuration of a switching circuit for a millimeter waveband control circuit according to one exemplary embodiment of the present invention.

Referring to FIG. 1, the switching circuit 100 includes two RF1 and RF2 signal ports 101 and 102, a common port 103, a switching cell-1 110 disposed in a path for the RF1 signal port 101, a switching cell-2 120 disposed in a path for the RF2 signal port 102, a terminal node 104 disposed between the switching cell-1 110 and the switching cell-2 120 and coupled to the common port 103, and a transmission line 130 coupled between the terminal node 104 and the common port 103. For the switching circuit 100, capacitors 140 and 150 for stabilizing biases of the switching cell-1 110 and the switching cell-2 120 are coupled respectively to the switching cell-1 110 and the switching cell-2 120, and the switching cells 110 and 120 and the bias pads 105 and 106 for controlling the switching circuit 100 are coupled in parallel to the capacitors 140 and 150, respectively.

The two switching cells 110 and 120 preferably has a structure is optimized to match an interested waveband (hereinafter, referred to a 'W-band'). A transistor used for the switching cells 110 and 120 is preferably a field effect transistor.

The T-junction-type terminal node (throw) 104 for coupling the two signal ports 101 and 102 to the common port transmission line 130 has a certain impedance value so as to reduce the ON-state insertion loss among the common port (pole) 103, the signal port 102 or the common port 103 and the signal port 101, and to enhance the OFF-state isolation.

The capacitors 140 and 150 for stabilizing biases preferably have a ground metal-insulator-metal (MIM) structure.

The switching circuit 100 according to one exemplary embodiment of the present invention as configured thus is characterized in that it is configured so that it can have excellent OFF-state isolation without deteriorating the ON-state insertion loss through the use of the switching cell 110 or 120 whose conditions are optimized in an interested frequency waveband, and reduce the size of chips through the simplified design of the chips. Then, the switching circuit 100 will be described in detail, as follows.

First, the switching circuit 100 has a switching cell structure in which built-in transistors and ground via holes are disposed in transmission lines at the optimum distance, as shown in FIG. 1. According to one exemplary embodiment of the present invention, it is described that two transistors and four ground via holes are disposed in one switching cell. Here, the characteristics of the ON-state isolation and the OFF-state insertion loss are varied according to the number of the ground via holes, and the interested frequency waveband is determined according to the distance of the disposed transistors. Hereinafter, the above-mentioned configuration will be described in more detail with reference to the accompanying FIG. 2.

Since the switching circuit 100 has a symmetrical switching cell structure as shown in FIG. 1, it is very important to enhance the low insertion loss and the isolation of the switching cells 110 and 120 while matching the interested frequency waveband with the switching cells 110 and 120 that are used in the path for each of the RF1 and RF2 signal ports 101 and 102.

Figure 2:
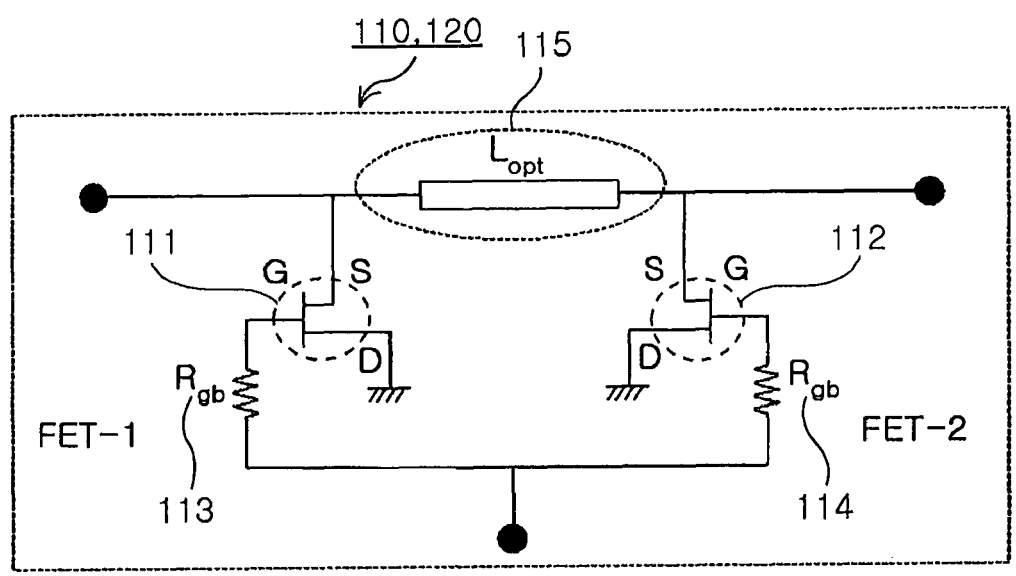
FIG. 2 is a diagram illustrating a schematic configuration of a switching cell as shown in FIG. 1.

Therefore, it is possible to design the switching cell 110, for example by optimally combining the two transistors 111 and 112, which include the gate bias resistor 113 and 114 respectively, with the transmission line 115 for coupling the transistors 111 and 112, the switching cell 110 having an input/output matching characteristics in a millimeter waveband of 85 to 95 GHz and showing an excellent isolation of 30 dB or more without deteriorating the ON-state insertion loss, as shown in FIG. 2.

More particularly, the transistors 111 and 112 are matched through the impedance matching of the input/output transmission line 115, thereby matching their input/output ports, and prevents the signal transmission onto the output port by sequentially transmitting an input signal to a plurality of the via holes when the transistors 111 and 112 are turned on. The transistors 111 and 112 have a structure in which a source electrode or a drain electrode are coupled to the ground via holes for ground connection, and includes a gate-coupling metal, an air-bridge metal for drain electrode for coupling a drain electrode to the input/output transmission line, and an air-bridge metal for source electrode for coupling a source electrode to the input/output transmission line. The gate bias resistors 113 and 114 are coupled to the fronts of the gate electrodes in the transistors 111 and 112.

Also, the switching circuit 100 according to the present invention may be useful to reduce a chip size of an integrated circuit through the simple circuit design and layout due to the optimized symmetrical structure of the switching cells 110 and 120, and thus reduce the manufacturing cost through the improved yield and integration of the manufacturing process.

Figure 3:
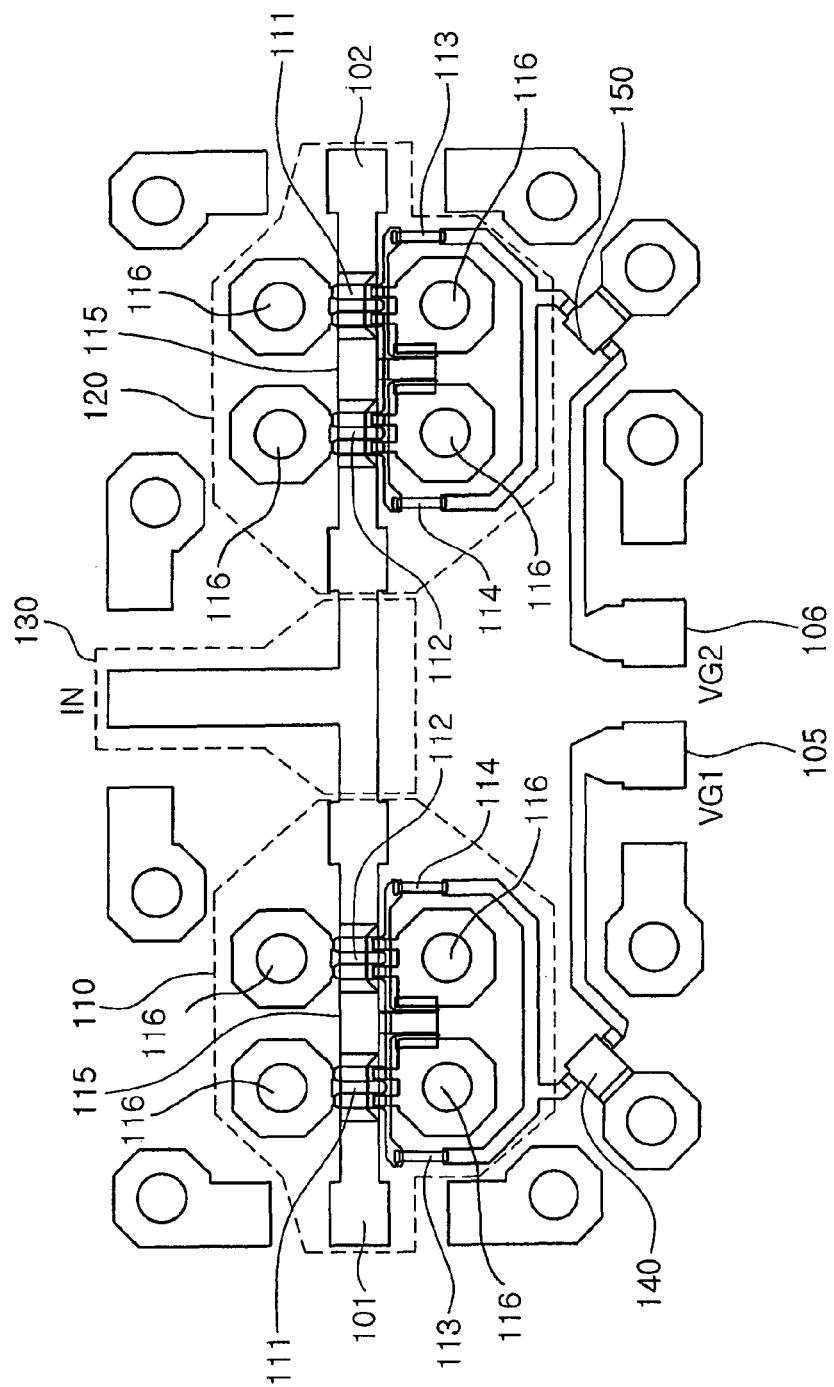
FIG. 3 is a diagram illustrating a layout of the switching circuit for a millimeter waveband control circuit according to the present invention.

FIG. 3 is a diagram illustrating a layout of the switching circuit for a millimeter waveband control circuit according to the present invention.

Referring to FIG. 3, the switching circuit 100 according to the present invention includes a switching cell 110 for a RF1 port, a switching cell 120 for a RF2 port, a transmission line 130 for a common port 103, capacitors 140 and 150 for stabilizing a gate bias, gate bias pads 105 and 106, and a plurality of ground via holes 116.

The design of the multiple port switching circuit may be easily carried out in the millimeter waveband using the switching cells 110 and 120 whose interested frequencies are optimized as described above. In addition, the switching cells 110 and 120 have their structures to enhance the OFF-state isolation without deteriorating the OFF-state insertion loss. Therefore, it is possible to obtain the isolation, which may be obtained using a conventional 3 or more-layer transistor structure, using one switching cell structure that is composed of a 2-layer transistor and one transmission line. As a result, the manufacture of small switch elements, and thus the reduction in the manufacturing cost are possible since there is no need for the use of the multi-stage shunt structure for the purpose of improvement of the isolation.

Figure 4:
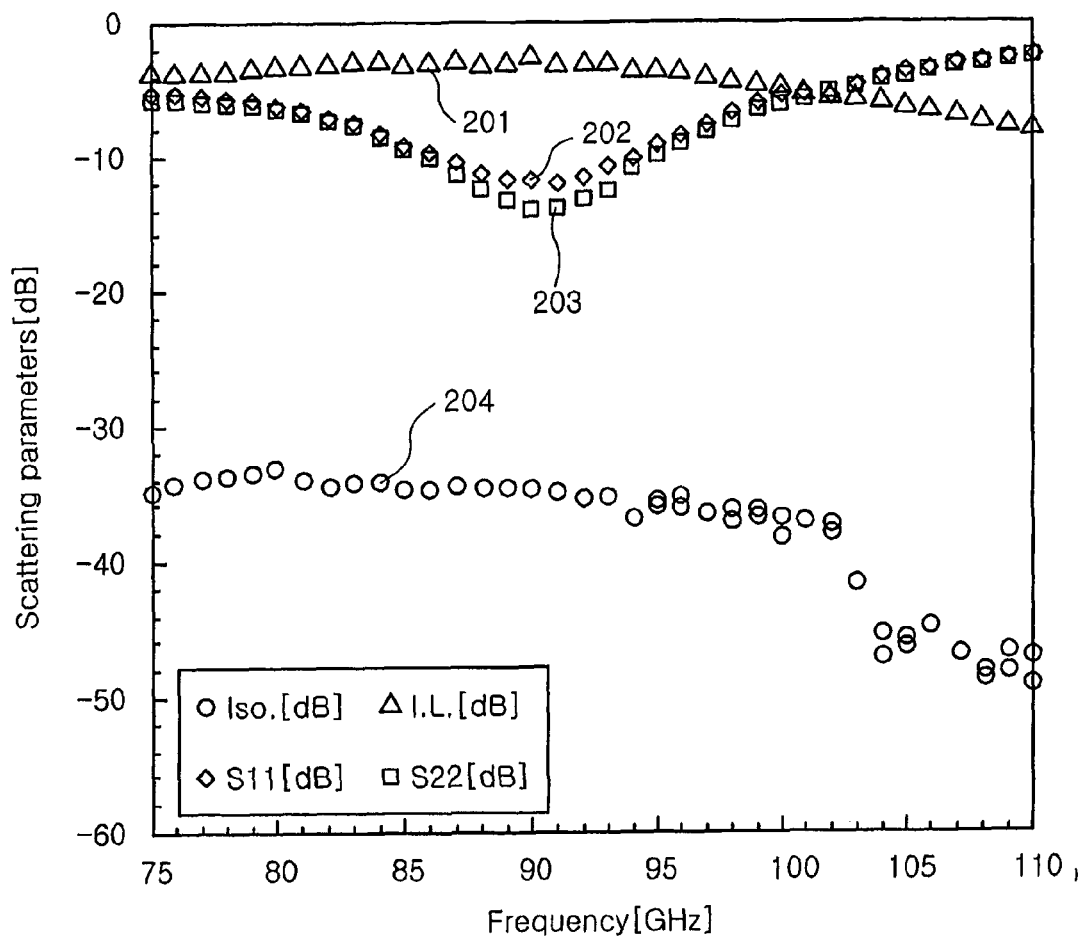
FIG. 4 is a graph illustrating the input and output matching characteristics, the isolation and the insertion loss characteristics as measured according to the frequencies in the switching cell of the switching circuit for a millimeter waveband control circuit according to the present invention.

The characteristics such as input and output matching characteristics, isolation and insertion loss according to the frequency in the switching cell of the millimeter waveband switching circuit as configured thus are summarized as shown in FIG. 4. In FIG. 4, 202 represents input matching characteristics of a switching cell, 203 represents output matching characteristics of a switching cell, 201 represents ON-state insertion loss characteristics, and 204 represents OFF-state isolation characteristics.

Referring to FIG. 4, the switching cell has a bandwidth of 10 GHz that is optimized in the center frequency of 90 GHz. The switching cell shows a high isolation of 35 dB or more in the entire frequency range, which indicates that the high isolation value is sufficient for the isolation of 30 dB that is required between two paths of the switching circuit.

Figure 5:
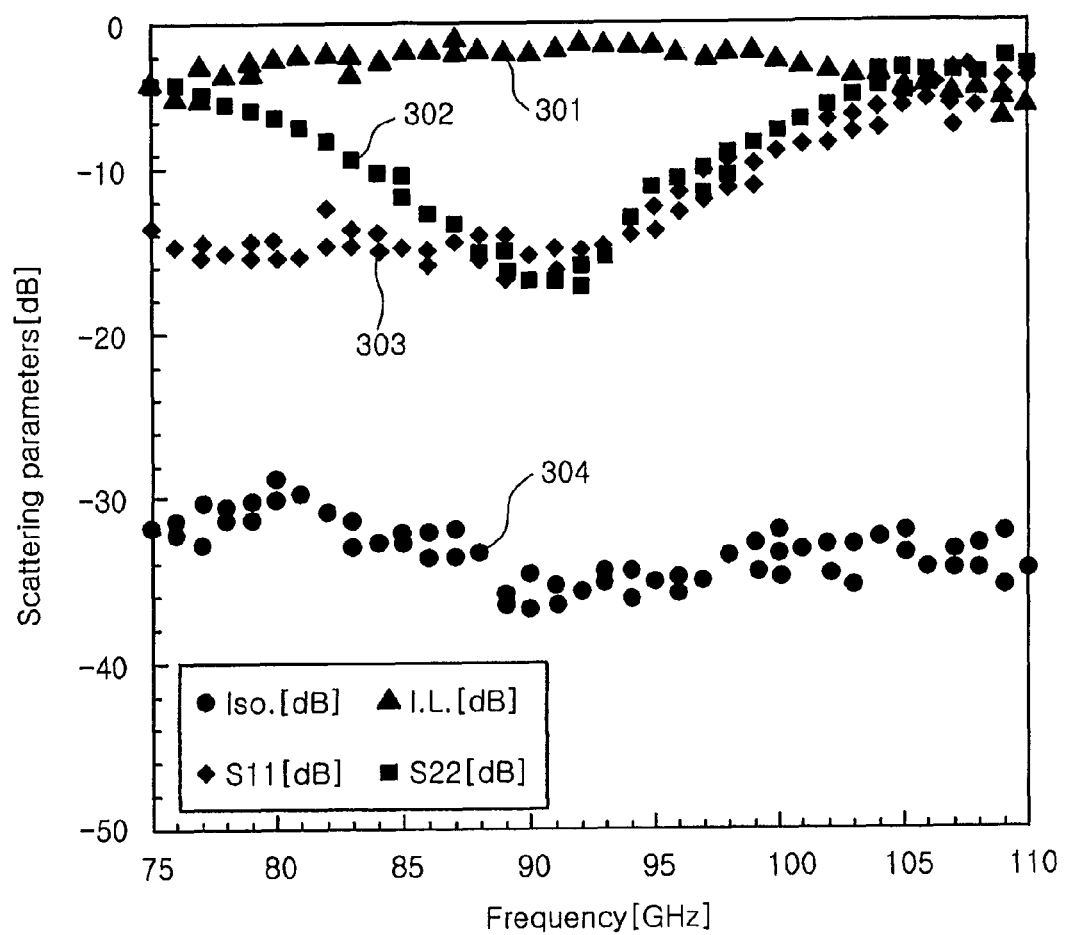
FIG. 5 is a graph illustrating the input and output matching characteristics, the isolation and the insertion loss characteristics as measured according to the frequencies after manufacturing a single-pole-double-throw (SPDT) switching circuit according to the method as shown in FIG. 1 using the switching cell of the switching circuit as shown in FIG. 4.

FIG. 5 is a graph illustrating the input and output matching characteristics, the isolation and the insertion loss characteristics as measured according to the frequencies after manufacturing an SPDT switching circuit according to the method as shown in FIG. 1 using the switching cell of the switching circuit as shown in FIG. 4. In FIG. 5, 303 represents the input matching characteristics of a switching circuit, 302 represents the output matching characteristics of a switching circuit, 301 represents ON-state insertion loss characteristics, and 304 represents OFF-state isolation characteristics.

Referring to FIG. 5, the SPDT switching circuit shows frequency characteristics that are similar to those of the switching cell as shown in FIG. 4, and the frequency characteristics are compared as listed in the following Table 1. Here, it is seen that a bandwidth of 10 GHz or more and an isolation of 30 dB or more in the center frequency of 90 GHz are sufficient for the SPDT switching circuit.

TABLE 1

| Frequency (GHz) | Item | S11 (dB) | S22 (dB) | I.L. (dB) | Iso. (dB) |
|---|---|---|---|---|---|
| 85 | SW-Cell | −8.90 | −9.50 | −2.89 | −34.56 |
|  | SPDT | −14.56 | −11.21 | −3.11 | −32.42 |
| 90 | SW-Cell | −11.62 | −14.05 | −2.29 | −34.38 |
|  | SPDT | −15.35 | −16.82 | −3.25 | −36.73 |
| 95 | SW-Cell | −9.24 | −10.23 | −3.16 | −36.01 |
|  | SPDT | −12.60 | −11.49 | −2.75 | −35.19 |

As described above, the switching circuit for a millimeter waveband control circuit according to the present invention may be useful to improve its isolation by simplifying its design and layout through the use of symmetrical structure of optimized switching cells without the separate use of different switch elements, and also to reduce its manufacturing cost through the improved yield of the manufacturing process and the enhanced integration since it is possible to reduce a chip size of an integrated circuit in addition to its low insertion loss.

While the present invention has been shown and described in connection with the exemplary embodiments, it will be apparent to those skilled in the art that modifications and variations can be made without departing from the spirit and scope of the invention as defined by the appended claims.

What is claimed is:

1. A switching circuit for a millimeter waveband control circuit, comprising:
a switching cell disposed on a signal port path to match a frequency, the switching cell including an input/output transmission line, two transistors each coupled vertically to a respective end of the input/output transmission line, and a plurality of ground via holes disposed symmetrically in an upper portion and a lower portion of the input/output transmission line;
a capacitor for stabilizing a bias of the switching cell; and
a bias pad coupled in parallel to the capacitor to control the switching cell.

2. The switching circuit of claim 1, further comprising a terminal transmission line coupled to the switching cell through a terminal port for coupling the switching cell to the common terminal port.

3. The switching circuit of claim 1, wherein an ON-state impedance of the transistors decreases with an increase of a number of the ground via holes, so that the switching cell decreases ON-state insertion loss and increases OFF-state isolation.

4. The switching circuit of claim 1, wherein each transistor has a source electrode or a drain electrode coupled to one of the ground via holes for ground connection.

5. The switching circuit of claim 4, wherein the transistor is a compound semiconductor transistor or a field effect transistor.

6. The switching circuit of claim 1, wherein the ground via holes enhance the OFF-state isolation by preventing leakage of an input signal.

7. A switching circuit for a millimeter waveband control circuit, comprising:
a switching cell disposed on a signal port path to match a frequency, the switching cell including an input/output transmission line, two transistors coupled vertically to both ends of the input/output transmission line, and a plurality of ground via holes disposed symmetrically in an upper portion and a lower portion of the input/output transmission line;
a capacitor for stabilizing a bias of the switching cell; and
a bias pad coupled in parallel to the capacitor to control the switching cell;
wherein each transistor, through an impedance matching of the input/output transmission line, matches an input port to an output port, and sequentially transfers input signals to a plurality of the ground via holes to prevent the input signals from being transmitted into the output port when the transistor is in an ON state.

8. A switching circuit for a millimeter waveband control circuit, comprising:
a switching cell disposed on a signal port path to match a frequency, the switching cell including an input/output transmission line, two transistors coupled vertically to both ends of the input/output transmission line, and a plurality of ground via holes disposed symmetrically in an upper portion and a lower portion of the input/output transmission line;
a capacitor for stabilizing a bias of the switching cell; and
a bias pad coupled in parallel to the capacitor to control the switching cell;
wherein the switching cell comprises:
a gate-coupling metal for coupling a gate electrode of the transistor;
a first air-bridge metal for coupling a drain electrode of the transistor to the input/output transmission lines; and
a second air-bridge metal for coupling the source electrode of the transistor to the input/output transmission lines.

9. The switching circuit of claim 1, wherein the switching cell is a first switching cell, and the switching circuit further comprises a second switching cell disposed on the signal port path to match frequencies, and a terminal transmission line coupled to the first and second switching cells through a terminal port for coupling the first and second switching cells to the common terminal port.

10. The switching circuit of claim 1, wherein each of the two transistors has a source electrode electrically connected to a corresponding end of the input/output transmission line.

* * * * *